(12) United States Patent
Kim et al.

(10) Patent No.: US 9,343,427 B2
(45) Date of Patent: May 17, 2016

(54) MANUFACTURING METHOD OF SEMICONDUCTOR DEVICE AND SEMICONDUCTOR DEVICE MANUFACTURED THEREBY

(71) Applicant: Amkor Technology, Inc., Chandler, AZ (US)

(72) Inventors: Jin Seong Kim, Goyang-si (KR); In Bae Park, Seoul (KR); Kwang Seok Oh, Seongnam-si (KR)

(73) Assignee: Amkor Technology, Inc., Tempe, AZ (US)

( * ) Notice: Subject to any disclaimer, the term of this patent is extended or adjusted under 35 U.S.C. 154(b) by 72 days.

(21) Appl. No.: 14/477,363

(22) Filed: Sep. 4, 2014

(65) Prior Publication Data

US 2015/0279811 A1 Oct. 1, 2015

(30) Foreign Application Priority Data

Mar. 25, 2014 (KR) .......................... 10-2014-0034897

(51) Int. Cl.
*H01L 21/00* (2006.01)
*H01L 23/00* (2006.01)
*H01L 21/78* (2006.01)
*H01L 21/56* (2006.01)
*H01L 21/683* (2006.01)

(52) U.S. Cl.
CPC .............. *H01L 24/96* (2013.01); *H01L 21/568* (2013.01); *H01L 21/6835* (2013.01); *H01L 21/78* (2013.01); *H01L 2221/6834* (2013.01); *H01L 2221/68327* (2013.01); *H01L 2924/12042* (2013.01)

(58) Field of Classification Search
CPC ..................... H01L 2924/181; H01L 2224/97; H01L 21/78; H01L 2221/68327
USPC .................. 438/107, 108, 109, 110, 113, 127
See application file for complete search history.

(56) References Cited

U.S. PATENT DOCUMENTS 7,682,874 B2 * 3/2010 Xiaochun ........... H01L 23/3114
257/E21.503
8,575,006 B2 * 11/2013 Xue ..................... H01L 21/4842
438/460

(Continued)

FOREIGN PATENT DOCUMENTS

KR 10-2012-0009868 A 2/2012
KR 10-2014-0005775 A 1/2014

OTHER PUBLICATIONS

Office Action issued Jul. 13, 2015 in Korean Patent Application No. KR 10-2014-0034897, 6 pages.

*Primary Examiner* — Sheila V Clark
(74) *Attorney, Agent, or Firm* — McAndrews, Held & Malloy, Ltd.

(57) ABSTRACT

A method of manufacturing a semiconductor device that can be transferred to a circuit board with improved product reliability, and a semiconductor device manufactured according to the method, are described. A non-limiting example of the manufacturing method includes preparing a wafer having multiple semiconductor die portions formed on the semiconductor wafer, performing a sawing operation to separate the multiple semiconductor die portions into multiple discrete semiconductor die, arranging the multiple discrete semiconductor die on an adhesive member, encapsulating the multiple semiconductor die using an encapsulant, and performing a second sawing operation upon the encapsulated multiple semiconductor die to produce multiple individual encapsulated semiconductor devices.

20 Claims, 4 Drawing Sheets

(56) References Cited

U.S. PATENT DOCUMENTS

2013/0078807 A1\* 3/2013 Park .................... H01L 21/561 438/675

2013/0119533 A1\* 5/2013 Chen .................... H01L 25/0652 257/737

\* cited by examiner

MANUFACTURING METHOD OF SEMICONDUCTOR DEVICE AND SEMICONDUCTOR DEVICE MANUFACTURED THEREBY

CROSS-REFERENCE TO RELATED APPLICATIONS/INCORPORATION BY REFERENCE

The present application makes reference to, claims priority to, and claims the benefit of Korean Patent Application No. 10-2014-0034897, filed on Mar. 25, 2014, the contents of which is hereby incorporated herein by reference, in its entirety.

FIELD

The present invention relates to a method of manufacturing a semiconductor device and a semiconductor device manufactured using the disclosed method.

BACKGROUND

In general, a discrete semiconductor die may be fabricated by forming a plurality of semiconductor die on a wafer, and sawing the wafer to separate the plurality of semiconductor die. The semiconductor die may then be mounted on a circuit board or a semiconductor device. In such an approach, however, in the course of transferring the semiconductor die to the circuit board or the semiconductor device, the semiconductor die may be damaged.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

A semiconductor device, and a method of manufacturing such a semiconductor device, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

Figure 1A:
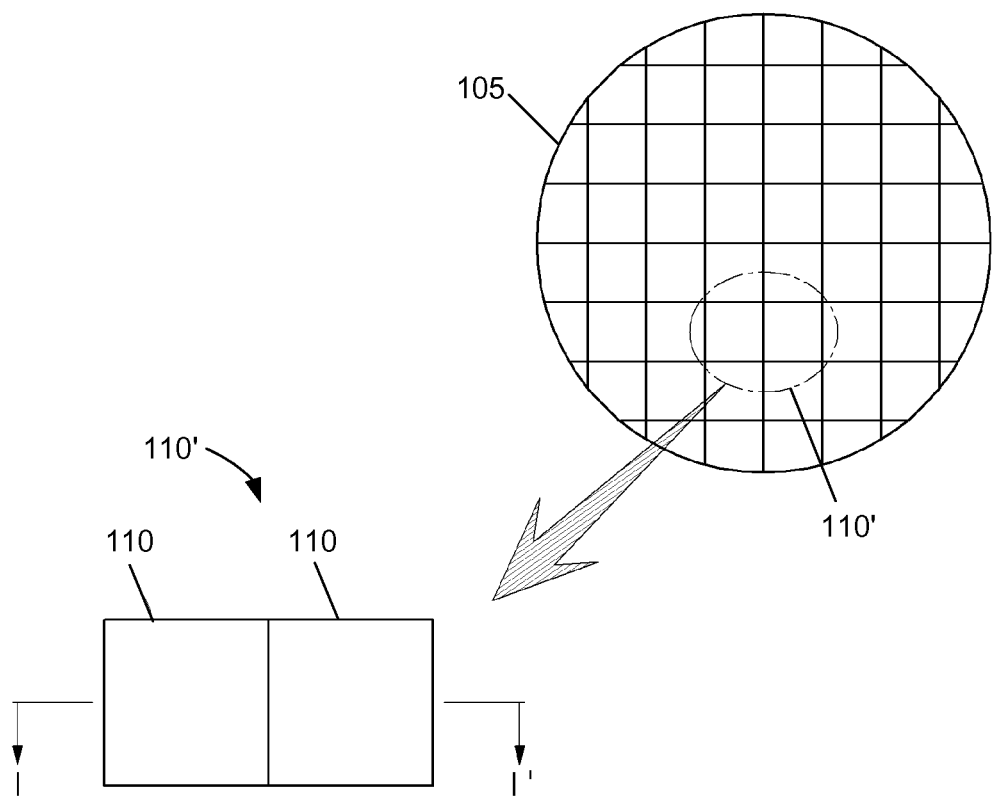
FIG. 1A to FIG. 1E illustrate an example method of manufacturing a semiconductor device, according to an embodiment of the present disclosure.

Aspects of the present disclosure relate to a semiconductor device and a method of manufacturing such a semiconductor device. More specifically, representative embodiments of the present disclosure relate to a method of manufacturing an encapsulated semiconductor device in which a wafer comprising a plurality of semiconductor die portions is prepared, the semiconductor wafer is sawed to separate the plurality of semiconductor die of the wafer into a plurality of individual semiconductor die. The individual die are then physically arranged on an adhesive member, an encapsulant is applied to the plurality of semiconductor die and the adhesive member, and the encapsulant is sawed between the semiconductor die to form a plurality of encapsulated semiconductor die.

Various aspects of the present disclosure will be described in more detail with reference to the accompanying drawings. Those skilled in the art will easily realize various aspects of the present disclosure upon reading the present patent application.

It should be noted that the thickness or size of each the illustrated elements may be exaggerated for clarity in the accompanying drawings, and that like reference numerals may refer to like elements. Additionally, the term "semiconductor die" in this specification includes, for example, a semiconductor chip having an active circuit and/or a passive circuit, a semiconductor wafer, or suitable equivalents thereof.

As utilized herein, the terms "example," "e.g.," and "exemplary" mean serving as a non-limiting example, instance, or illustration. Also, as utilized herein, the term "representative" means serving as a non-limiting example, instance, or illustration.

The following discussion may at times utilize the phrase "A and/or B." Such phrase should be understood to mean just A, or just B, or both A and B. Similarly, the phrase "A, B, and/or C" should be understood to mean just A, just B, just C, A and B, A and C, B and C, or all of A and B and C.

Hereinafter, examples of embodiments of the present disclosure will be described in detail with reference to the accompanying drawings such that they can easily be made and used by those skilled in the art. Like numbers may refer to like elements throughout. In addition, when it is said that an element is electrically coupled to another element, it will be understood that these elements may be directly coupled to each other and may be coupled to each other with one or more other elements interposed therebetween.

Hereinafter, the embodiments of the present disclosure will be described in detail with reference to the accompanying drawings. In the following description, well-known functions or constitutions will not be described in detail if they would obscure the subject matter of the present disclosure in unnecessary detail. Further, the terminologies to be described below are defined in consideration of functions in the present disclosure and may vary depending on intentions or practices of a user or an operator. Accordingly, the definition may be made on a basis of the content throughout the specification.

Hereinafter, exemplary embodiments of the invention will be described in detail with reference to the accompanying drawings; however, they may be embodied in different forms and should not be construed as limited to the embodiments set forth herein. Rather, these embodiments are provided so that this disclosure will be thorough and complete, and will convey various aspects of the disclosure to those skilled in the art.

In the drawings, various thicknesses of layers and regions may be exaggerated for clarity.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "include," "including," "comprise," and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1A to FIG. 1E illustrate an example method of manufacturing a semiconductor device, according to an embodiment of the present disclosure.

The method of manufacturing a semiconductor device according to an embodiment of the present disclosure may comprise preparing a semiconductor wafer comprising a plurality of semiconductor die portions, first sawing the semiconductor wafer to separate the semiconductor die portions into a plurality of individual semiconductor die, encapsulating a spaced arrangement of the plurality of semiconductor die, and second sawing the encapsulation to form a plurality of individual encapsulated semiconductor die.

FIG. 1A illustrates an example semiconductor wafer 105 having a plurality of semiconductor die formed on the illustrated surface of the wafer 105, in accordance with a representative embodiment of the present disclosure. As illustrated in the example of FIG. 1A, a semiconductor wafer 105 comprising a plurality of semiconductor die portions formed in a generally two dimensional arrangement on the illustrated surface of the semiconductor wafer 105 may be prepared, using a semiconductor fabrication process. Following preparation of the semiconductor wafer 105, the semiconductor wafer 105 may be sawed to produce separated semiconductor die portions (i.e., semiconductor die) of the semiconductor wafer 105. In the illustration of FIG. 1A, a semiconductor wafer portion 110' of the semiconductor wafer 105 comprising two semiconductor die 110 is shown. It should be noted that the illustration of a portion 110' of the semiconductor wafer 105 comprising two semiconductor die 110 is solely for purposes of illustration, and does not represent a specific limitation of the present disclosure. The semiconductor wafer 105 may comprise, by way of example and not limitation, a silicon material, and may comprise any number of semiconductor die 110.

Figure 1B:
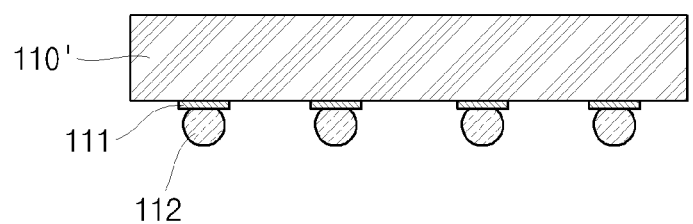

FIG. 1B is a cross-sectional view of the portion 110' of the example semiconductor wafer 105 as viewed along the line I-I' of FIG. 1A, in accordance with a representative embodiment of the present disclosure. As illustrated in the example of FIG. 1B, each of two semiconductor die 110 of the semiconductor wafer portion 110' may comprise a plurality of bond pads 111, which may be formed on a bottom surface (e.g., an active surface, a passive surface with conductive couplings to an active surface, etc.) of the semiconductor wafer 105 during fabrication, and may include a plurality of conductive members 112 on one or more of the bond pads 111. Each of the conductive members 112 may comprise, by way of example and not limitation, a solder material, which may be in the shape of a bump, a ball, a cap on a conductive pillar, etc. The conductive members 112 may, for example, be welded or soldered to the bond pads 111 or otherwise formed on the bond pads 111.

Figure 1C:
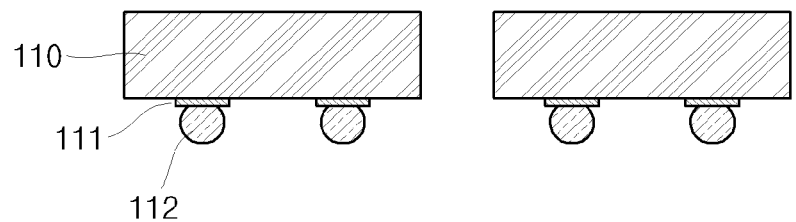

Referring now to the illustrative example of FIG. 1C, a first sawing operation may include sawing the semiconductor wafer 105 to form two discrete semiconductor die 110. As mentioned herein, though only two discrete semiconductor die 110 are illustrated, this is for illustrative clarity only. In practice, where will generally be many more discrete semiconductor die 110 than two. In the first sawing operation, the semiconductor wafer 105 having the plurality of semiconductor die may be sawed to form the discrete semiconductor die 110. As part of the first sawing operation, the semiconductor wafer portion 110' may be separated into the two discrete semiconductor die 110 shown in FIG. 1C, using a sawing tool such as, by way of example and not limitation, a diamond wheel or a laser beam. In a representative embodiment according to the present disclosure, the two semiconductor die 110 illustrated may be two of a type of semiconductor die, or may be two different types of semiconductor die having different circuitry and elements, without departing from the scope of the present disclosure.

Figure 1D:
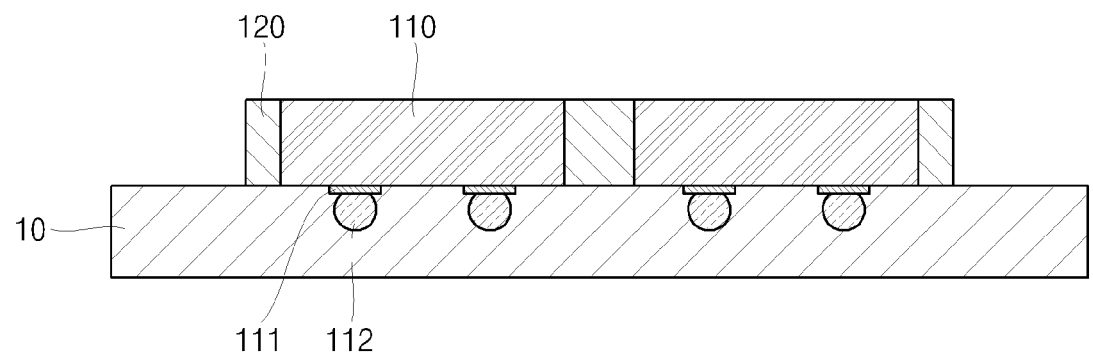

Referring now to the illustration of FIG. 1D, an encapsulation operation may comprise encapsulating the plurality of semiconductor die 110 separated in the first sawing operation illustrated in the example of FIG. 1C, using an encapsulant 120. In performing the encapsulation operation, the separated plurality of semiconductor die 110 may be arranged on an adhesion member 10 and spaced a particular distance apart from each other, which may, for example, be different particular distances along one dimension, or each of a width dimension and a length dimension of the semiconductor die 110. In accordance with an embodiment of the present disclosure, the plurality of semiconductor die 110 arranged on the adhesion member 10 may then be encapsulated, using the encapsulant 120. The adhesion member 10 may comprise, by way of example and not limitation, an epoxy-based resin. In accordance with the present disclosure, the plurality of semiconductor die 110 may be arranged on the adhesion member 10. Pressure may then be applied to each of the plurality of semiconductor die 110 in the direction of the surface of the adhesion member 10, so that the conductive members 112 and bond pads 111 may, in some representative embodiments of the disclosure, be pressed into the adhesion member 10 until the surface upon which the plurality of semiconductor die 110 is arranged is in direct contact with the surface of the semiconductor die 110 on which the bond pads 112 are disposed. In this manner, the bottom surface of each of the plurality of semiconductor die 110 may be brought into contact with the adhesion member 10. The encapsulation operation may then encapsulate the plurality of semiconductor die 110 using the encapsulant 120. It should be noted that, although the illustration of FIG. 1D shows only two semiconductor die 110, a greater number of semiconductor die 110 may be encapsulated using the disclosed approach, without departing from the scope of the present disclosure. In an exemplary embodiment according to the present disclosure, the encapsulation operation may be performed, by way of example and not limitation, by over molding using a transfer molding machine. In accordance with a representative embodiment of the present disclosure, the encapsulant 120 may be formed to encapsulate only side surfaces of the semiconductor die 110. That is to say, a top surface and a bottom surface of the semiconductor die 110 may be exposed by the encapsulant 120. Further, the contact of the adhesive member 10 may cover the surface of the semiconductor die 110 and may occlude flow of the encapsulant 120 onto the surface of the semiconductor die 110 on which the bond pads 111 are disposed. In addition, the encapsulant 120 may be formed to fill the space between the sides of the neighboring ones of the plurality of semiconductor die 110 that are arranged on the adhesion member 10. In this way, each semiconductor die of the plurality of semiconductor die 110 arranged on the adhesion member 10 may be connected to another by the encapsulant 120, as illustrated in the example of FIG. 1D.

Figure 1E:
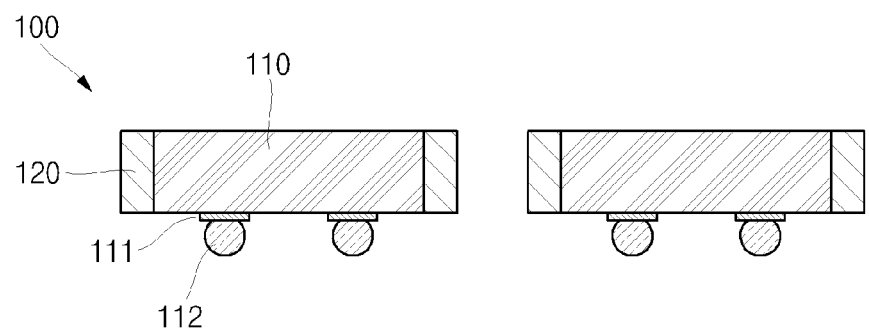

Referring now to the illustrative example of FIG. 1E, a second sawing operation may be performed that includes sawing the encapsulant 120 to produce a plurality of individual encapsulated semiconductor devices 100. In the second sawing operation, the encapsulant 120 formed between the plurality of semiconductor die 110 during the example encapsulation operation of FIG. 1D may be sawed using, by way of example and not limitation, a diamond saw or laser beam, thereby forming two encapsulated semiconductor devices 100. In accordance with an exemplary embodiment of the present disclosure, the second sawing operation may comprise removing the adhesion member 10, before or after the encapsulant 120 between the neighboring ones of the semiconductor die 110 is sawed.

As can be seen in connection with the preceding discussion, a semiconductor device manufactured according to the aforementioned example manufacturing method may, for example, comprise: a semiconductor die 110 having a plurality of bond pads 111 formed on a surface, a plurality of conductive members 112 bonded to the bond pads 111, and an encapsulant 120 encapsulating side surfaces of the semiconductor die 110. In an example semiconductor device 100 according to an embodiment of the present disclosure, the encapsulant 120 may be formed on only the side surfaces of the semiconductor die 110, which may reduce or suppress warpage of the semiconductor die 110 from occurring due to differences in the coefficients of thermal expansion of the semiconductor die 110 and the encapsulant 120. Because the encapsulant 120 may have a relatively small coefficient of thermal expansion, and the semiconductor die 110 may have a coefficient of thermal expansion that is larger than that of the encapsulant 120, various aspects of the present disclosure may reduce or suppress warpage from occurring to the semiconductor die 110 of the semiconductor device 100.

In an example semiconductor device according to an embodiment of the present disclosure, such as the semiconductor device 100 described above, the encapsulant 120 may be formed on the side surfaces of the semiconductor die 110, thereby reinforcing strength of the semiconductor device 100. Therefore, the semiconductor device 100 may be safely transferred to, for example, a circuit board or semiconductor device, and product reliability is improved.

Figure 2A:
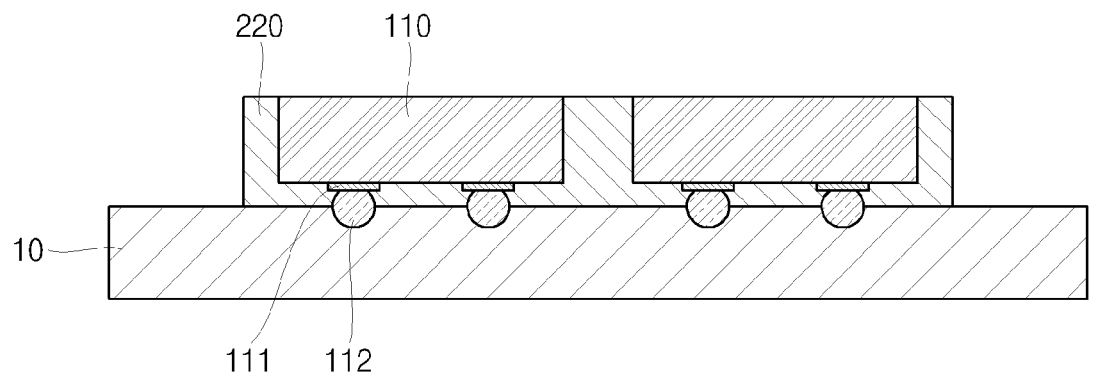
FIG. 2A and FIG. 2B are cross-sectional views illustrating an example method of manufacturing a semiconductor device, according to an embodiment of the present disclosure.
Figure 2B:
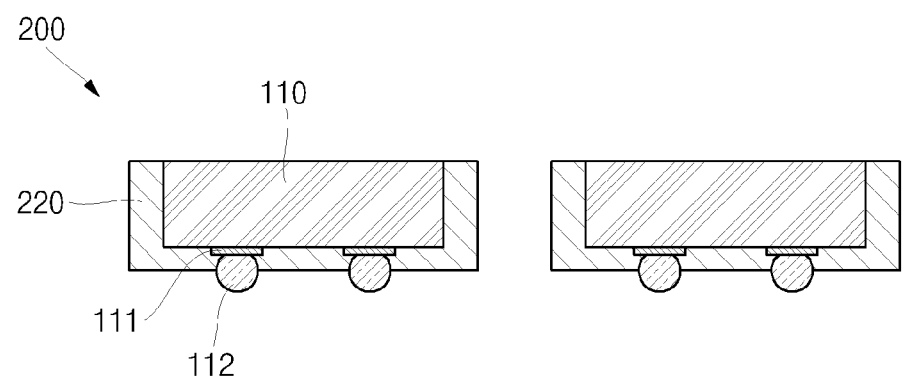

FIG. 2A and FIG. 2B are cross-sectional views illustrating an example method of manufacturing a semiconductor device, according to an embodiment of the present disclosure. The example method shown in FIG. 2A and FIG. 2B may, for example, share any or all characteristics with the example method shown in FIG. 1A-1E.

As illustrated in the example of FIG. 2A, during an encapsulation process, side surfaces and a bottom surface of a semiconductor die 110 may be encapsulated using an encapsulant 220. In such an example encapsulation process, a plurality of semiconductor die 110 may be arranged a particular distance from one another on an adhesion member 10. As shown in the illustrative example of FIG. 2A, a plurality of conductive members 112 attached to the semiconductor die 110 may be lightly pressed into a surface of the adhesion member 10. Such conductive members 112 may correspond to, for example, the conductive members 112 of FIG. 1B through FIG. 1D, and may be, for example, a solder material in the shape of a bump, a ball, a cap on a conductive pillar, etc. The conductive members 112 may, for example, be attached to the bond pads 111 by, for example, a welding or soldering operation. In contrast to the example embodiment of FIG. 1B through FIG. 1E, however, the semiconductor die 110 with conductive members 112 of FIG. 2A may not be pressed with as much force towards the surface of the adhesion member 10 on which the semiconductor die 110 are arranged, as in the example embodiment illustrated in FIG. 1B through FIG. 1E, and a space may be formed between a bottom surface of each of the semiconductor die 110 and the adhesion member 10. In other words, only a portion (e.g., approximately 50%, 25% to 50% for example for exposing more than half, 40% to 60% for example for exposing approximately half, 50% to 75% for example for exposing less than half, etc.) of the conductive members 112 of FIG. 2A might be embedded in the adhesion member 10, leaving the remainder exposed, for example exposed to contact with an encapsulant. An encapsulant such as the encapsulant 220 may then be injected into a space between each semiconductor die 110 and neighboring semiconductor die 110, and also into the spaces between the bottom surface of each semiconductor die 110 and the adhesion member 10. The encapsulant 220 may therefore encapsulate the sides of each of the semiconductor die 110 and the bottom surface of each of the semiconductor die 110, including the bond pads 111 and a portion of the conductive members 112 of each semiconductor die 110. A portion of the conductive members 112 may be exposed by the encapsulant, for example for an attachment forming an electrical connection to circuitry external to the semiconductor device. In this manner, a representative embodiment of the present disclosure may form the encapsulant 220 to surround each of the semiconductor die 110, and a portion of the conductive members 112, and may leave exposed the surface of the semiconductor die 110 opposite that on which the bond pads 111 are disposed. In the example encapsulation process, the side surfaces of the semiconductor die 110 are encapsulated using the encapsulant 220, which is formed to encapsulate the side surfaces and the bottom surface of the semiconductor die 110. Therefore, a top surface of the semiconductor die 110 is exposed through the encapsulant 220. In addition, the encapsulant 220 is formed between the plurality of semiconductor die 110 arranged on the adhesion member 10. Therefore, each semiconductor die 100 of the plurality of semiconductor die 110 is connected to another by the encapsulant 220.

Referring now to the example illustrated in FIG. 2B, in a second sawing process, the encapsulant 220 formed between the plurality of semiconductor die 110 may be sawed, thereby producing a plurality of individual encapsulated semiconductor devices 200. Each of the example semiconductor devices 200 comprises a semiconductor die 110 having a plurality of bond pads 111 and a plurality of conductive members 112. The conductive members 112 may, for example, comprise a solder material in the shape of a bump, a ball, a cap on a conductive pillar, etc., and may be attached to the bond pads 111 using, by way of example and not limitation, a welding or soldering operation. Each of the semiconductor devices 200 also comprises an encapsulant 220 encapsulating side surfaces and a bottom surface of the semiconductor die 110. In a representative embodiment of the present disclosure, the encapsulant 220 formed on the side surfaces and the bottom surface of the semiconductor die 110 reinforces the strength of the semiconductor device 200. Therefore, the semiconductor device 200 may be transferred to a circuit board with lower probability of damage to and failure of the semiconductor die 110, and product reliability is improved.

Figure 3A:
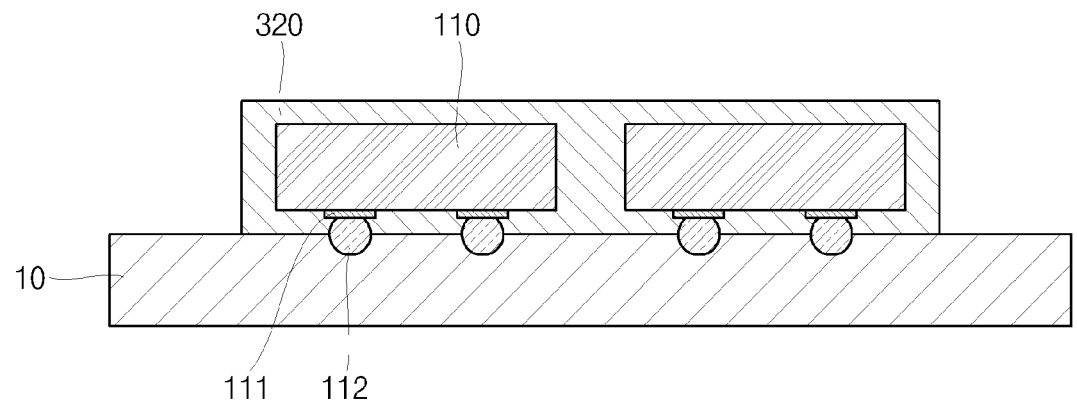
FIG. 3A and FIG. 3B are cross-sectional views illustrating an example method of manufacturing a semiconductor device, according to an embodiment of the present disclosure.
Figure 3B:
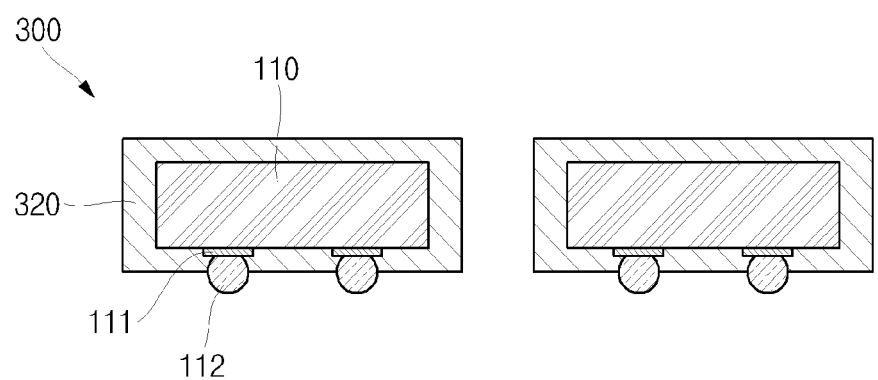

FIG. 3A and FIG. 3B are cross-sectional views illustrating an example method of manufacturing a semiconductor device, according to an embodiment of the present disclosure. The example method shown in FIG. 2A and FIG. 2B may, for example, share any or all characteristics with the example method shown in FIG. 1A-1E and/or with the example method shown in FIG. 2A-2B.

As illustrated in the example of FIG. 3A, in an encapsulation process, side surfaces, a bottom surface and a top surface of a semiconductor die 110 may be encapsulated. In such an embodiment, an encapsulant 320 may be formed to entirely encapsulate the semiconductor die 110. As in the example of FIG. 2A and FIG. 2B, the semiconductor die 110 with bond pads 111 and conductive members 112 may be arranged in a particular spaced relation to one another on an adhesive member 10, and may be pressed into the adhesive member in a manner similar to that described above with respect to FIG. 2A. However, in the example embodiment of FIG. 3A, the encapsulation process may also cover the top surface of the semiconductor die 110, which was exposed by the encapsulant in the example of FIG. 2A and FIG. 2B.

As illustrated in the example of FIG. 3B, in a second sawing process, the encapsulant 320 formed between the semiconductor die 110 may be sawed, thereby manufacturing a plurality of individual encapsulated semiconductor devices 300. Each of the example semiconductor devices 300 comprise a semiconductor die 110 having a plurality of bond pads 111 and a plurality of conductive members 112 that may, for example, comprise a solder material formed in the shape of a bump, a ball, a cap on a conductive pillar, etc. The conductive members 112 may be attached to the bond pads 111 using, by way of example and not limitation, a welding or soldering process. The semiconductor devices 300 also comprise an encapsulant 320 that encapsulates the side surfaces, a bottom surface, a portion of each of the conductive members 112, and a top surface of the semiconductor die 110. In a semiconductor device such as the semiconductor device 300, according to still another embodiment of the present disclosure, the encapsulant 320 may be formed on the side surfaces, the bottom surface, and the top surface of the semiconductor die 110, thereby reinforcing the strength of the semiconductor die 110 of the semiconductor device 300. Therefore, the semiconductor device 300 may be transferred to, for example, a circuit board with a lower rate of damage and failure, and product reliability is improved.

This disclosure provides exemplary embodiments relating to the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

In accordance with an aspect of the present disclosure, there is provided a method of manufacturing a semiconductor device, the manufacturing method including preparing a semiconductor wafer having a plurality of semiconductor die formed on the semiconductor wafer, and first sawing the semiconductor wafer to separate the semiconductor wafer into discrete semiconductor die. The method may also include arranging the discrete semiconductor die spaced apart from each other, and encapsulating the semiconductor die using an encapsulant. The method may further include a second sawing of the encapsulant to manufacture individual semiconductor devices.

In the encapsulating, the semiconductor die may be arranged on an adhesion member. In addition, in the encapsulating, the encapsulant may encapsulate side surfaces of each of the semiconductor die. In addition, in the encapsulating, the encapsulant may encapsulate side surfaces and a bottom surface of each of the semiconductor die. In addition, in the encapsulating, the encapsulant may encapsulate side surfaces, a bottom surface, and a top surface of each of the semiconductor die. The encapsulant may be formed between the arranged semiconductor die, and in the second sawing, the encapsulant formed between the arranged semiconductor dies may be sawed to manufacture individual semiconductor devices. At least one bond pad and a solder ball coupled to the bond pad may be provided on the bottom surface of each of the semiconductor die.

In accordance with another aspect of the present disclosure, there is provided a semiconductor device including a semiconductor die having at least one bond pad and a solder ball coupled to the bond pad formed on its bottom surface, and an encapsulant encapsulating the semiconductor die. The encapsulant may be formed to encapsulate side surfaces of the semiconductor die. In addition, the encapsulant may be formed to encapsulate side surfaces and a bottom surface of the semiconductor die. In addition, the encapsulant may be formed to encapsulate side surfaces, a bottom surface and a top surface of the semiconductor die.

As described above, in the manufacturing method of a semiconductor device according to an embodiment of the present disclosure, semiconductor die manufactured in the form of a wafer may be sawed into discrete semiconductor die, which are then arranged spaced apart from each other, followed by encapsulating and sawing to manufacture individual semiconductor devices, thereby reinforcing strength of the semiconductor device and reducing or preventing the semiconductor device from being warped. Therefore, a semiconductor device according to the present disclosure may be transferred to a circuit board and product reliability is improved.

Aspects of the present disclosure may be found in a method of manufacturing a semiconductor device. Such a method may comprise preparing a semiconductor wafer comprising a plurality of semiconductor die portions; and performing a first sawing operation upon the semiconductor wafer to separate the semiconductor wafer into a plurality of discrete semiconductor die. Each of the discrete semiconductor die may have a first surface, an opposing second surface, and a plurality of side surfaces connecting the first surface to the second surface. The method may also comprise arranging the plurality of discrete semiconductor die at a particular distance from one another on an adhesive member, and applying an encapsulant to the plurality of discrete semiconductor die and to the adhesive member to produce an encapsulated plurality of semiconductor die. The method may further comprise performing a second sawing operation upon the encapsulated plurality of semiconductor die, to produce a plurality of individual encapsulated semiconductor devices.

In a representative embodiment according to the disclosure, the first surface may comprise a plurality of bond pads and a plurality of conductive members attached to the plurality of bond pads, and arranging the plurality of discrete semiconductor die on the adhesive member may comprise applying pressure upon the second surface of each of the plurality of semiconductor die to cause the adhesive member to cover a portion of the conductive members. The pressure upon the second surface of each of the plurality of semiconductor die may cause the first surface of each of the plurality of semiconductor die to come into direct contact with the adhesive member. In some representative embodiments, application of the encapsulant may encapsulate the plurality of side surfaces of each of the plurality of semiconductor die, while in other embodiments, while in other representative embodiments, application of the encapsulant may encapsulate the plurality of side surfaces and the first surface of each of the plurality of semiconductor die. In yet other representative embodiments, application of the encapsulant may encapsulate the plurality of side surfaces, the first surface, and the second surface of each of the plurality of semiconductor die.

In various representative embodiments in accordance with the present disclosure, application of the encapsulant may fill a space between neighboring side faces of the arranged semiconductor die, and in the second sawing operation, the encapsulant formed between the arranged plurality of semiconductor die may be sawed to produce a plurality of individual encapsulated semiconductor devices. Performing the second sawing operation may comprise removing the adhesive member from the plurality of semiconductor devices.

Additional aspects of the present disclosure may be seen in a method of manufacturing a semiconductor device. Such a method may comprise performing a first sawing operation upon a semiconductor wafer comprising a plurality of semiconductor die portions to produce a corresponding plurality of discrete semiconductor die. Each discrete semiconductor die may have a first surface, an opposing second surface, a plurality of side surfaces connecting the first surface to the second surface, and a plurality of bond pads having an attached conductive member. The method may also comprise arranging the plurality of discrete semiconductor die in spaced relation on an adhesive member, where arranging may comprise applying pressure to the second surface of each of the plurality of discrete semiconductor die to cause covering of a respective portion of each of the plurality of conductive members for forming an electrical connection to circuitry external to the discrete semiconductor die. The method may further comprise applying an encapsulant to the plurality of discrete semiconductor die and to the adhesive member to produce an encapsulated plurality of semiconductor die, and performing a second sawing operation upon the encapsulated plurality of semiconductor die, to produce a plurality of individual encapsulated semiconductor devices.

In a representative embodiment in accordance with the present disclosure, the pressure applied to the second surface of each of the plurality of semiconductor die may cause the first surface of each of the plurality of semiconductor die to be formed in direct contact with the adhesive member. In some representative embodiments, application of the encapsulant may encapsulate the plurality of side surfaces of each of the plurality of semiconductor die, while in other representative embodiments, application of the encapsulant may encapsulate the plurality of side surfaces and the first surface of each of the plurality of semiconductor die. In yet other representative embodiments, application of the encapsulant may encapsulate the plurality of side surfaces, the first surface, and the second surface of each of the plurality of semiconductor die. Application of the encapsulant may fill a space between neighboring side faces of the arranged semiconductor die, and in the second sawing operation, the encapsulant formed between the arranged plurality of semiconductor die may be sawed to produce a plurality of individual encapsulated semiconductor devices. Performing the second sawing operation comprises removing the adhesive member from the plurality of semiconductor devices, and each of the plurality of conductive members may comprise a solder material in the shape of a ball.

Further aspects of the present disclosure may be found in a semiconductor device. Such a semiconductor device may comprise a semiconductor die comprising a first surface, an opposing second surface, a plurality of side surfaces connecting the first surface and the second surface, a plurality of bond pads disposed on the first surface, and a plurality of conductive members attached to the plurality of bond pads. The semiconductor device may also comprise an encapsulant encapsulating the semiconductor die and exposing a portion of each of the plurality of conductive members for forming an electrical connection to circuitry external to the semiconductor die. In some representative embodiments, the encapsulant may be formed to encapsulate only the plurality of side surfaces of the semiconductor die, and the encapsulant may be formed to encapsulate the plurality of side surfaces and the first surface of the semiconductor die, excluding the exposed portion of each of the plurality of conductive members. In other representative embodiments, the encapsulant may be formed to encapsulate the plurality of side surfaces, the first surface excluding the exposed portions of each of the plurality of conductive members, and the second surface, of the semiconductor die.

The present application provides a number of exemplary embodiments of the inventive concepts contained herein. The scope of the present disclosure is not limited by these exemplary embodiments. Numerous variations, whether explicitly provided for by the specification or implied by the specification, such as variations in structure, dimension, type of material and manufacturing process, may be implemented by one skilled in the art in view of this disclosure.

While the description of the present disclosure has been made with respect to the exemplary embodiments, various changes and modifications may be made without departing from the scope of the disclosure. Therefore, the scope of the present disclosure should be defined by the appended claims rather than by the example embodiments shown herein.

While the present disclosure has been described with reference to certain embodiments, it will be understood by those skilled in the art that various changes may be made and suitable equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method of manufacturing a semiconductor device, the method comprising:
   receiving a semiconductor wafer comprising a plurality of semiconductor die portions;
   performing a first sawing operation on the semiconductor wafer to separate the semiconductor wafer into a plurality of discrete semiconductor die, each discrete semiconductor die comprising:
      a first surface;
      a second surface opposite the first surface;
      a plurality of side surfaces connecting the first surface to the second surface;
      a bond pad on the first surface; and
      a conductive member extending from the bond pad in a direction perpendicular to the first surface;
   arranging the plurality of discrete semiconductor die at a spacing distance from one another on an adhesive member such that the first surface of each of the plurality of discrete semiconductor die contacts the adhesive member;
   applying an encapsulant to the plurality of discrete semiconductor die and to the adhesive member to produce an encapsulated plurality of semiconductor die; and
   performing a second sawing operation upon the encapsulated plurality of semiconductor die, to produce a plurality of individual encapsulated semiconductor devices.

2. The method according to claim 1, wherein said arranging comprises arranging the plurality of discrete semiconductor die such that the conductive member of each of the plurality of discrete semiconductor die is completely embedded in the adhesive member.

3. The method according to claim 2, wherein the conductive member comprises a solder ball.

4. The method according to claim 1, wherein said applying an encapsulant comprises encapsulating each of the plurality of discrete semiconductor die with the encapsulant only at the plurality of side surfaces of each of the plurality of discrete semiconductor die.

5. The method according to claim 1, wherein said applying an encapsulant comprises encapsulating each of the plurality of discrete semiconductor die with the encapsulant only at the plurality of side surfaces and the second surface of each of the plurality of discrete semiconductor die.

6. The method according to claim 1, wherein:
said applying an encapsulant comprises filling a space between neighboring side surfaces of the arranged plurality of discrete semiconductor die with encapsulant; and
said performing a second sawing operation comprises sawing the encapsulant formed between the side faces of the arranged plurality of discrete semiconductor die to produce a plurality of individual encapsulated semiconductor devices.

7. The method according to claim 1, wherein said performing a second sawing operation comprises removing the adhesive member from the plurality of semiconductor devices.

8. The method according to claim 1, comprising removing the plurality of semiconductor devices from the adhesive member after said performing a second sawing operation.

9. A method of manufacturing a semiconductor device, the method comprising:
receiving a semiconductor wafer comprising a plurality of semiconductor die portions;
performing a first sawing operation on the semiconductor wafer to separate the semiconductor wafer into a plurality of discrete semiconductor die, each discrete semiconductor die comprising:
a first surface;
a second surface opposite the first surface;
a plurality of side surfaces connecting the first surface to the second surface;
a bond pad on the first surface; and
a conductive member extending from the bond pad in a direction perpendicular to the first surface;
arranging the plurality of discrete semiconductor die at a spacing distance from one another on an adhesive member such that only a portion of the conductive member of each of the discrete semiconductor die is embedded in the adhesive member;
applying an encapsulant to the plurality of discrete semiconductor die and to the adhesive member to produce an encapsulated plurality of semiconductor die; and
performing a second sawing operation upon the encapsulated plurality of semiconductor die, to produce a plurality of individual encapsulated semiconductor devices.

10. The method according to claim 9, wherein the conductive member comprises a solder ball.

11. The method according to claim 9, wherein said applying an encapsulant comprises encapsulating each of the plurality of discrete semiconductor die with the encapsulant only at the plurality of side surfaces of each of the plurality of discrete semiconductor die.

12. The method according to claim 9, wherein said applying an encapsulant comprises encapsulating each of the plurality of discrete semiconductor die with the encapsulant only at the plurality of side surfaces and the first surface of each of the plurality of discrete semiconductor die.

13. The method according to claim 9, wherein said applying an encapsulant comprises encapsulating each of the plurality of discrete semiconductor die with the encapsulant at the plurality of side surfaces, the first surface, and the second surface of each of the plurality of discrete semiconductor die.

14. The method according to claim 9, wherein said arranging the plurality of discrete semiconductor die comprises arranging the plurality of discrete semiconductor die such that 25% to 75% of the conductive member of each of the discrete semiconductor die is embedded in the adhesive member.

15. The method according to claim 9, wherein said arranging the plurality of discrete semiconductor die comprises arranging the plurality of discrete semiconductor die such that 25% to 50% of the conductive member of each of the discrete semiconductor die is embedded in the adhesive member.

16. The method according to claim 9, wherein:
said applying an encapsulant comprises filling a space between neighboring side surfaces of the arranged plurality of discrete semiconductor die with encapsulant; and
said performing a second sawing operation comprises sawing the encapsulant formed between the side faces of the arranged plurality of discrete semiconductor die to produce a plurality of individual encapsulated semiconductor devices.

17. The method according to claim 9, wherein said performing a second sawing operation comprises removing the adhesive member from the plurality of semiconductor devices.

18. The method according to claim 9, comprising removing the plurality of semiconductor devices from the adhesive member after said performing a second sawing operation.

19. A method of manufacturing a semiconductor device, the method comprising:
receiving a semiconductor wafer comprising a plurality of semiconductor die portions;
performing a first sawing operation on the semiconductor wafer to separate the semiconductor wafer into a plurality of discrete semiconductor die, each discrete semiconductor die comprising:
a first surface;
a second surface opposite the first surface;
a plurality of side surfaces connecting the first surface to the second surface;
a bond pad on the first surface; and
a conductive member extending from the bond pad in a direction perpendicular to the first surface;
arranging the plurality of discrete semiconductor die at a spacing distance from one another on an adhesive member such that the conductive member of each of the discrete semiconductor die contacts the adhesive member;
applying an encapsulant to the plurality of discrete semiconductor die and to the adhesive member to produce an encapsulated plurality of semiconductor die, wherein the plurality of side surfaces, the first surface, and the second surface of each of the plurality of discrete semiconductor die are encapsulated; and
performing a second sawing operation upon the encapsulated plurality of semiconductor die, to produce a plurality of individual encapsulated semiconductor devices.

20. The method according to claim 19, wherein said arranging the plurality of discrete semiconductor die comprises arranging the plurality of discrete semiconductor die such that 25% to 50% of the conductive member of each of the discrete semiconductor die is embedded in the adhesive member.

* * * * *